(12) United States Patent
Lan et al.

(10) Patent No.: US 6,969,997 B2
(45) Date of Patent: Nov. 29, 2005

(54) POWER SOURCE TEST INSTRUMENT

(75) Inventors: Tzong-Hsinang Lan, Kao-Hsiung (TW); Wen-Way Chen, Ping-Tung Hsien (TW)

(73) Assignee: BenQ Corporation, Tao-Yuan Hsien (TW)

( * ) Notice: Subject to any disclaimer, the term of this patent is extended or adjusted under 35 U.S.C. 154(b) by 17 days.

(21) Appl. No.: 10/708,699

(22) Filed: Mar. 19, 2004

(65) Prior Publication Data

US 2004/0183543 A1    Sep. 23, 2004

(30) Foreign Application Priority Data

Mar. 21, 2003 (TW) ............... 92106403 A

(51) Int. Cl.[7] ............ G01R 31/02; H02J 7/00; G01N 27/416
(52) U.S. Cl. ............ 324/537; 324/426; 320/106
(58) Field of Search ............ 320/106, 107–115; 324/555, 771, 537, 425–450; 702/63, 60–62

(56) References Cited

U.S. PATENT DOCUMENTS

| | | | |
|---|---|---|---|
| 4,570,116 A * | 2/1986 | Tedd et al. | 324/649 |
| 6,054,864 A * | 4/2000 | Butts | 324/548 |
| 6,323,650 B1 * | 11/2001 | Bertness et al. | 324/426 |
| 6,664,761 B2 * | 12/2003 | Yudahira et al. | 320/116 |

* cited by examiner

Primary Examiner—Anjan Deb
Assistant Examiner—Jeff Natalini
(74) Attorney, Agent, or Firm—Winston Hsu

(57) ABSTRACT

A power source test instrument for a circuit includes a voltage test circuit and a current test circuit. Two operational amplifiers form the voltage test circuit and the current test circuit. The power source test instrument is convenient and saves time when conducing various kinds of tests including: charging, discharging, dummy battery loading, and current testing. Additionally the power source test instrument ensures a full test without damaging or requiring disassembly of the product under test.

11 Claims, 4 Drawing Sheets

POWER SOURCE TEST INSTRUMENT

The current application claims foreign priority to application 092106403 filed Mar. 21, 2003 in Taiwan.

BACKGROUND OF INVENTION

1. Field of the Invention

The present invention relates to a test instrument, and more specifically, to a power source test instrument for a circuit.

2. Description of the Prior Art

In modern society, portable electronic apparatuses, such as mobile phones, personal digital assistants (PDAs), walkmans, digital versatile disk players, hand-held computers, and notebook computers, by means of their portability, play a role for users to communicate mutually, access data, accumulate knowledge, and further raise the quality of living and work efficiency. As the size and weight of portable electronic apparatuses are reduced, it has become common to carry two or more portable apparatuses. For users" convenience, typical portable electronic apparatuses use rechargeable batteries for their power supply because a rechargeable battery can simply be recharged after use, which is more economical and environment-friendly.

Generally, common rechargeable batteries can be divided into nickel batteries and lithium batteries, and nickel batteries can be further divided into nickel—cadmium (NiCd) batteries and nickel—hydrogen (NiH) batteries. A NiCd battery uses a simple circuit, has better performance for rapid recharging, high load of current, long persistence and voltage firmness. However, a NiCd battery also has a strong memory effect which means, if the battery is not discharged before recharging, the battery stores the remaining electricity and cannot be fully recharged. Additionally, cadmium pollutes the environment. Because NiCd batteries are heavy in weight, are high polluting, and have a strong memory effect, they are gradually retiring from the market. NiH batteries are cadmium-free and reliable, meaning less polluting and more environment-friendly. Additionally, NiH batteries have a higher storage density than NiCd batteries, but as with NiCd batteries, NiH batteries also have a memory effect, however, it is less obvious.

Lithium batteries can be divided into lithium polymer batteries, lithium ion batteries, and lithium metal batteries. The lithium metal battery is the superior battery, having advantages that the two other types do not have. A lithium metal battery has high safety being safe from any physical or electrical influences, such as internal or external short, overcharge, over-discharge, or overheat. Additionally a lithium metal battery is a non-memory effect battery with its self discharge ratio at 1%–2% per month. It also has a smooth discharge curve and provides a strong current. A lithium ion battery is a high energy density battery with no memory effect and high storage, but it needs a special charger or it is incompletely discharged and short-lived. A lithium polymer battery is similar to a lithium ion battery. It is worth noting that a lithium polymer battery has the highest self discharge ratio up to 20% per month, and therefore a lithium polymer battery can be easily determined by testing this parameter.

As mentioned above, rechargeable batteries have great differences between types and, therefore, a rechargeable battery needs a special charger to properly charge the battery. For instance, a nickel battery must be discharged before being recharged but a lithium battery does not have this requirement. Additionally, a protection circuit is required to be installed in the charger to prevent over-charge or over-discharge. However, because the voltage of a battery rises when charging, it is not easy to check whether the protection circuit is in operation. Especially when chargers are mass-produced, a test instrument that does not cause damage to the charger is required. Moreover, in order to prevent over-discharge, a protection circuit is normally installed in a portable electronic apparatus and in the rechargeable battery. Consequently, a test instrument for testing whether the protection circuit works is also required.

SUMMARY OF INVENTION

It is therefore a primary objective of the present invention to provide a power source test instrument for a circuit in order to solve the problems mentioned above.

Briefly summarized, a power source test instrument for a circuit includes a voltage test circuit and a current test circuit. The voltage test circuit includes a first operational amplifier with a positive input terminal connected to a voltage source. A first set of relays have a first terminal connected to a negative input terminal of the first operational amplifier, a second terminal connected to an output terminal of the first operational amplifier, and a third terminal grounded via a first resistor. A second set of relays have a first terminal connected to the third terminal of the first set of relays, a second terminal grounded, and a third terminal. A third set of relays have a first terminal connected to an output terminal of the first operational amplifier, a second terminal connected to a first output terminal of the voltage test circuit, a third terminal connected to the third terminal of the second set of relays, and a fourth terminal connected to a second output terminal of the voltage test circuit. The current test circuit includes a second operational amplifier with four resisters connected to form a differential amplifier. The ratio of the resistance between a negative input terminal of the second operational amplifier and the output terminal of the second operational amplifier and the resistance between the negative input terminal of the second operational amplifier and a first input terminal of the differential amplifier is equivalent to the ratio of the resistance between a ground terminal and a positive input terminal of the second operational amplifier and the resistance between the positive input terminal of the second operational amplifier and a second input terminal of the differential amplifier. Additionally a second resistor is connected between the first input terminal and the second input terminal of the differential amplifier. Wherein the first set of relays can be switched to turn on the first terminal and the second terminal or to turn on the first terminal and the third terminal, the second set of relays can be switched to turn on the first terminal and the third terminal or to turn on the second terminal and the third terminal, the third set of relays can be switched to turn on the first terminal and the second terminal and to turn on the third terminal and the fourth terminal, or be switched to turn on the first terminal and the fourth terminal and to turn on the second terminal and the third terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
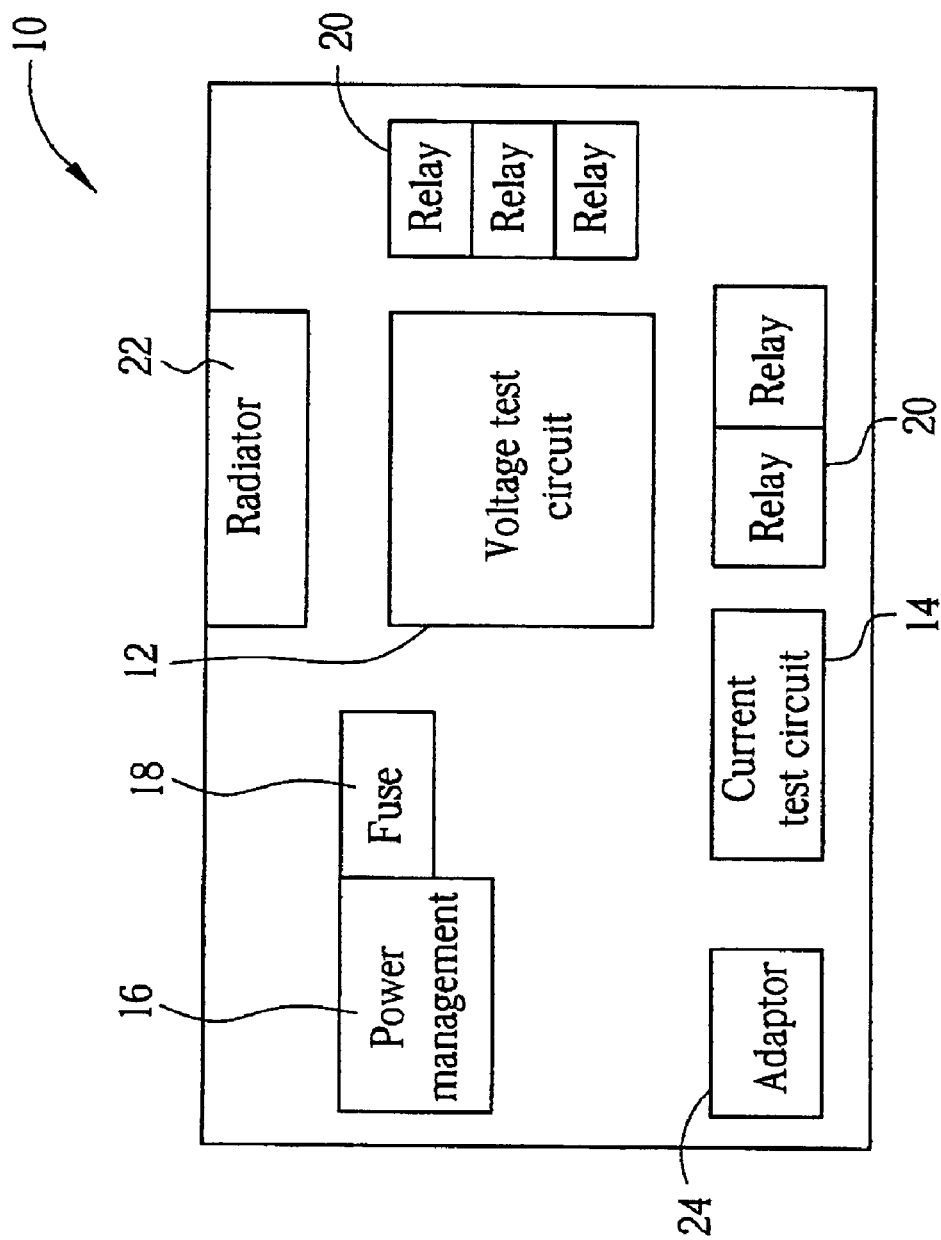
FIG. 1 is a block diagram of a power source test instrument according to the present invention.

Please refer to FIG. 1 showing a block diagram of a power source test instrument 10 according to the present invention. The power source test instrument 10 includes a voltage test circuit 12, a current test circuit 14, a power management circuit 16, a fuse 18, a plurality of relays 20, a radiator 22, and an adaptor 24. The voltage test circuit 12 and the current test circuit 14 are independent to each other, which means that the voltage test circuit 12 and the current test circuit 14 can be used independently and even simultaneously. The voltage test circuit 12 and the current test circuit 14 each include an operational amplifier. In this embodiment, the operational amplifier of the voltage test circuit 12 is an OPTDA2030 and the operational amplifier of the current test circuit 14 is an OPMC1741C. The power management circuit 16 is for providing voltage to the voltage test circuit 12 and the current test circuit 14, and for protecting the voltage test circuit 12 and the current test circuit 14 by fusing the power management circuit 16 with a fuse 18. The plurality of relays 20 are connected to the output terminals of the voltage test circuit 12 and the current test circuit 14. The switch of the relays 20 determined on the user and is for switching on and off the output of the voltage test circuit 12 and the current test circuit 14. The adaptor 24 is connected to the current test circuit 14 because an open circuit is required when testing currents.

Figure 2:
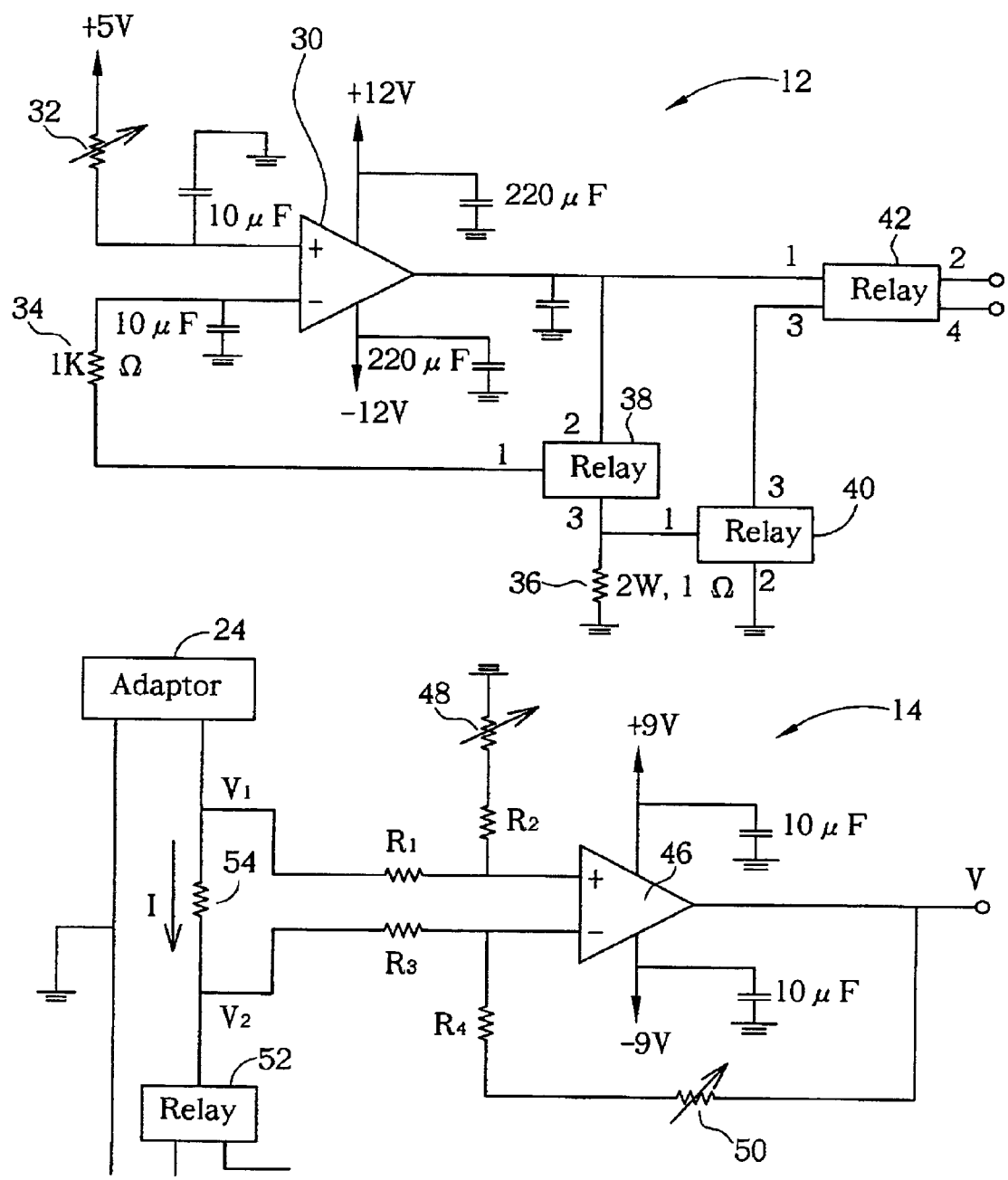
FIG. 2 is a circuit diagram of the voltage test circuit and the current test circuit.

Please refer to FIG. 2 showing a circuit diagram of the voltage test circuit 12. The voltage test circuit 12 is composed of the OPTDA2030 operational amplifier 30, supplied by a voltage of ±12V by the power management 16. Also included is a first set of relays 38, a second set of relays 40, and a third set of relays 42 for switching the output functions of the voltage test circuit 12. Additionally, capacitors of proper capacity are connected respectively to each terminal of the operational amplifier 30 for stabilizing the voltage. A positive input terminal of the operational amplifier 30 is connected to a voltage source via a variable resistor so that users can control the input voltage by adjusting the voltage source or the variable resistor. A negative input terminal of the operational amplifier 30 is connected to a first terminal of the first set of relays 38 via a third resistor 34, a second terminal of the first set of relays 38 is connected to an output terminal of the operational amplifier 30, and a third terminal of the first set of relays 38 is grounded via a first resistor 36. A first terminal of the second set of relays 40 is connected to the third terminal of the first set of relays 38, a second terminal of the second set of relays 40 is grounded, and a third terminal of the second set of relays 40 is connected to a third terminal of the third set of relays 42. A first terminal of the third set of relays 42 is connected to the output terminal of the operational amplifier 30, and a second terminal and a fourth terminal of the third set of relays 42 are a first output terminal and a second output terminal of the voltage test circuit 12 respectively. Since no current flows into the positive input terminal and the negative input terminal, and the positive input terminal and the negative input terminal form a virtual short circuit, which means that the voltage of the positive input terminal and the negative input terminal can be regarded to be equivalent. This kind of circuit structure makes the voltage test circuit 12 a dummy battery, a charger, or a discharger, which can be selected by controlling the first, the second, and the third sets of relays 38, 40, 42.

Figure 3:
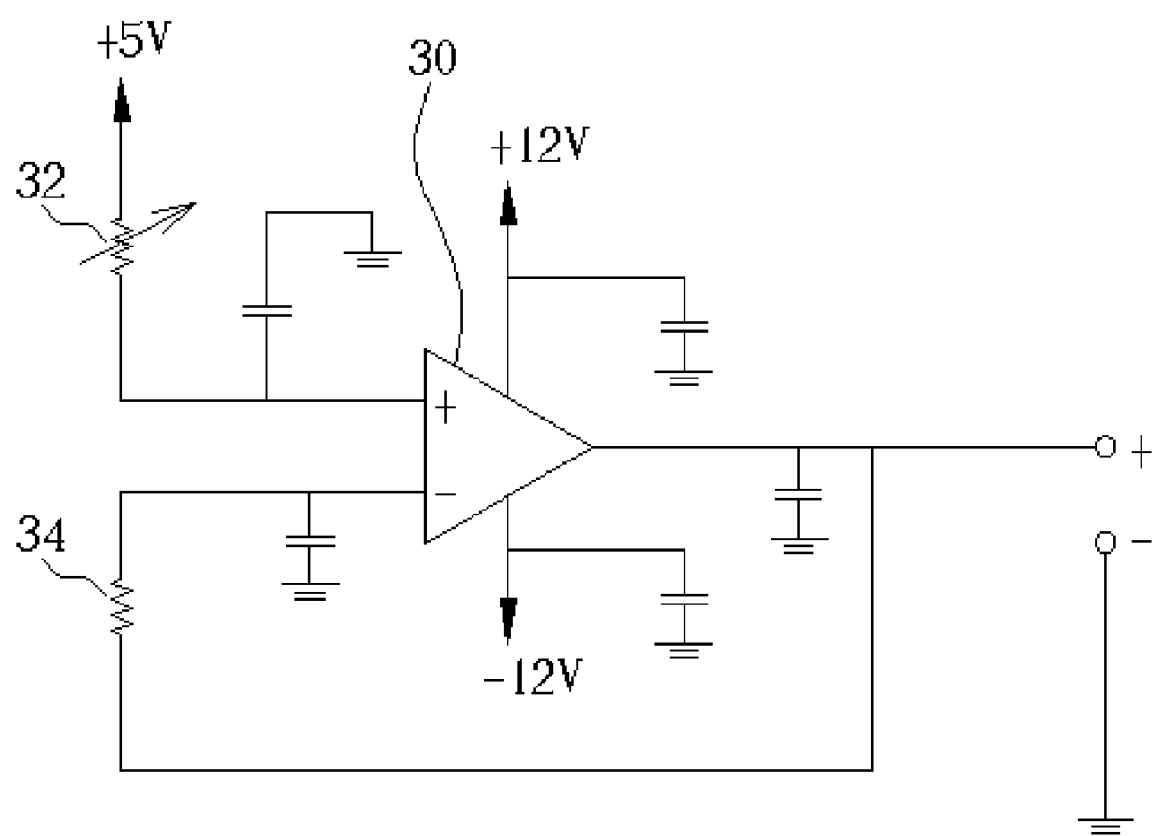
FIG. 3 is a circuit diagram illustrating the voltage test circuit used as a dummy battery.

Please refer to FIG. 3 showing a circuit diagram illustrating the voltage test circuit 12 used as a dummy battery. When the user configures the voltage test circuit 12 to a dummy battery, the first and the second terminal of the first set of relays 38 of the voltage test circuit 12 in FIG. 2 are turned on and the third terminal is turned off, the second and the third terminal of the second set of relays 40 are turned on and the first terminal is turned off, the first and the second terminal of the third set of relays 42 are turned on and the third and the fourth terminal are turned off. The voltage test circuit 12 will form the structure shown in FIG. 3. In this case, the second terminal of the third set of relays 42 is a positive pole of the dummy battery, the fourth terminal of the third set of relays 42 is a negative pole of the dummy battery, and the voltage of the dummy battery can be controlled by adjusting the voltage source or the variable resistor 32. Since the voltage of the dummy battery is adjustable, it is possible to make the dummy battery act as a dummy load by controlling the voltage of the dummy battery in order to test whether a protection circuit in a charger is in operation without damaging the charger. In addition, the dummy battery provides a stable voltage and can be regarded as an ideal battery. Therefore, when the dummy battery is being charged, the voltage does not raise and the energy is emitted via the operational amplifier 30 so that a heat sink (the radiator 22) is required to be installed on the operational amplifier 30 to prevent burn-down. Controlling the voltage of the dummy battery can test the transient voltage and the charging current of a portable apparatus. The stable voltage provided by the dummy battery can be used for testing the charging time and the current of the portable apparatus.

Figure 4:
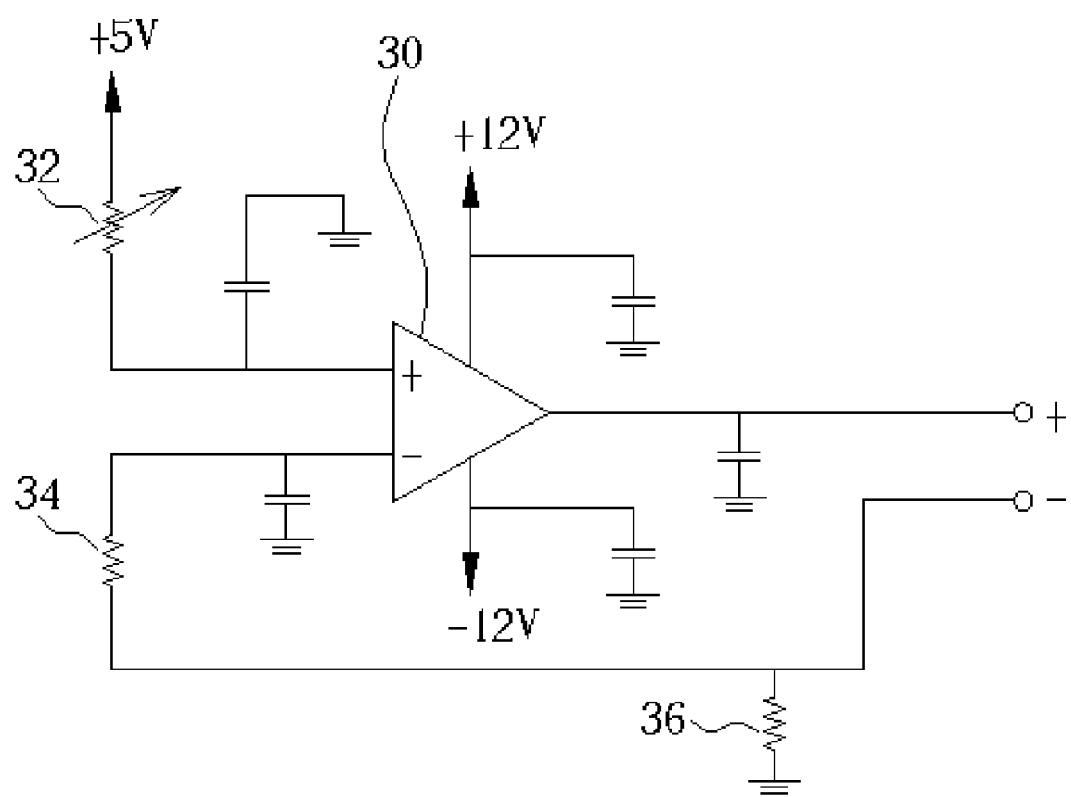
FIG. 4 is a circuit diagram illustrating the voltage test circuit used as a charger.

Please refer to FIG. 4 showing a circuit diagram illustrating the voltage test circuit 12 used as a charger. When the user switches the voltage test circuit 12 to a charger, the first and the second terminal of the first set of relays 38 of the voltage test circuit 12 in FIG. 2 are turned off and the first and the third terminal is turned on, the first and the second terminal of the second set of relays 40 are turned on and the first and the third terminal is turned off, the first and the second terminal of the third set of relays 42 are turned on and the third and the fourth terminal are also turned on. The voltage test circuit 12 will form the structure shown in FIG. 4. In this case, the second terminal of the third set of relays 42 is a positive pole of the charger connected to the positive pole of the battery, the fourth terminal of the third set of relays 42 is a negative pole of the charger connected to the negative pole of the battery. When the voltage test circuit 12 is configured as a charger, the negative pole of the charger is grounded via the first resistor 36 for providing a stable current according to the output voltage of the operational amplifier 30. In this embodiment, the first resistor 36 is specified as 1Ω (2 W). A negative feedback circuit of the operational amplifier 30 makes the input voltage equivalent to the output voltage, the input voltage can be controlled by adjusting the voltage source or the variable resistor 32, and a stable charging current is produced using the first resistor 36. In such a manner it is possible to test whether the protection circuit of the battery is turned on. In the case that the user switches the voltage test circuit 12 to a discharger, the first set of relays 38 and the second set of relays 40 of the voltage test circuit 12 remain unchanged, the first and the fourth terminal of the third set of relays 42 are turned on and the second and the third terminal are also turned on, in other words converting the positive and the negative poles of the output terminal of the third set of relays 42 reciprocally. By switching the relays, the user can insert the battery in an instructed direction and switch the voltage test circuit 12 to be a charger or a discharger, without concern as to whether the pole orientation is correct. The capacity of the battery can be known by discharging the battery by the discharger.

Please refer back to FIG. 2 showing a circuit diagram of the current test circuit 14. The current test circuit 14 is composed of the OPMC1741C operational amplifier 46, supplied a voltage of ±9V by the power management 16 and connected with proper capacitors to keep the voltage stable. The operational amplifier 46 uses an R1 resistor, an R2 resistor, an R3 resistor, and an R4 resistor to form a differential amplifier. The differential amplifier includes a first input terminal V2, a second input terminal V1 and an output terminal V. If R2/R1=R4/R3, then V=R2/R1 (V2−V1). In order to match the resistors, the R2 resistor and the R4 resistor can be connected serially with variable resistors 48, 50 respectively to ensure the proportion of the resistance. In this embodiment, the R1 and the R3 resistors are 1 kΩ and the R3 and the R4 resistors are 10 kΩ. The ratio of R2/R1 is 10, thus a second resistor 54 in 0.1Ω(2W) is connected between the V1 and the V2 so that the output voltage is equivalent to the current flow over the second resistor 54. Therefore, the current of the portable apparatus can be known by measuring the voltage. Because an open circuit is required when testing the current, the adaptor 24 is connected to the current test circuit 14 and switched by the fourth set of relays 52, in order to measure the output voltage and the output current of various kinds of chargers and to test the IV curve of the charger.

As mentioned above, the power source test instrument 10 according to the present invention uses two operational amplifiers 30, 46 to form the voltage test circuit 12 and the current test circuit 14. The power source test instrument 10 is convenient and saves time when conducting various kinds of tests including: charging, discharging, dummy battery loading, and current testing. The power source test instrument 10 can be a battery for any product utilizing direct current (DC). It can test the protection of software and the charging of hardware. By rapidly charging and discharging the battery, the capacity of the battery can be measured and whether or not the protection circuit is in operation can be tested. Additionally, the power source test instrument 10 ensures a full test without damaging or requiring disassembly of the product under test.

In contrast to the prior art, the present invention provides a convenient and efficient power source test instrument which can be a dummy battery, a charger, a discharger, and a current test instrument. Without damaging the rechargeable battery, the present invention can be used to test the current and voltage curve of portable apparatuses, the protection circuit and the capacity of the rechargeable battery, or whether the protection circuit is in operation.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A power source test instrument for a circuit comprising:
a voltage test circuit comprising:
a first operational amplifier with a positive input terminal connected to a voltage source;
a first set of relays with a first terminal connected to a negative input terminal of the first operational amplifier,
a second terminal connected to an output terminal of the first operational amplifier, and a third terminal grounded via a first resistor;
a second set of relays with a first terminal connected to a third terminal of the first set of relays, a second terminal grounded, and a third terminal; and
a third set of relays with a first terminal connected to an output terminal of the first operational amplifier, a second terminal connected to a first output terminal of the voltage test circuit, a third terminal connected to the third terminal of the second set of relays, and a fourth terminal connected to a second output terminal of the voltage test circuit;
a current test circuit comprising:
a second operational amplifier with four resisters connected to form a differential amplifier, wherein the ratio of the resistance between a negative input terminal of the second operational amplifier and the output terminal of the second operational amplifier and the resistance between the negative input terminal of the second operational amplifier and a first input terminal of the differential amplifier, is equivalent to the ratio of the resistance between a ground terminal and a positive input terminal of the second operational amplifier and the resistance between the positive input terminal of the second operational amplifier and a second input terminal of the differential amplifier; and
a second resistor connected between the first input terminal and the second input terminal of the differential amplifier;
wherein the first set of relays can be switched to turn on the first terminal and the second terminal or to turn on the first terminal and the third terminal, the second set of relays can be switched to turn on the first terminal and the third terminal or to turn on the second terminal and the third terminal, the third set of relays can be switched to turn on the first terminal and the second terminal and to turn on the third terminal and the fourth terminal or be switched to turn on the first terminal and the fourth terminal and to turn on the second terminal and the third terminal.

2. The test instrument of claim 1 wherein the positive input terminal of the first operational amplifier is connected to the voltage source via a variable resistor.

3. The test instrument of claim 1 wherein the negative input terminal of the first operational amplifier is connected to the first terminal of the first set of relays via a third resistor.

4. The test instrument of claim 1 wherein the resistance of the second resistor is a reciprocal of the ratio of the resistance between the negative input terminal and the output terminal of the second operational amplifier and the resistance between the negative input terminal of the second operational amplifier and the first input terminal of the differential amplifier.

5. The test instrument of claim 1 wherein the voltage source is a power management circuit used for providing a necessary voltage to the voltage test circuit and the current test circuit.

6. The test instrument of claim 1 further comprising at least one heat sink installed on the first operational amplifier and the second operational amplifier.

7. The test instrument of claim 6 further comprising a radiator to help the heat sink to radiate heat.

8. The test instrument of claim 1 further comprising a fuse connected to the voltage source for protecting the test instrument.

9. The test instrument of claim 1 wherein when the first terminal and the second terminal of the first set of relays are turned on, the second terminal and the third terminal of the second set of relays are turned on, the first terminal and the second terminal of the third set of relays are turned on, and the third terminal and the fourth terminal of the third set of relays are turned on, the voltage test circuit can be used as a dummy battery.

10. The test instrument of claim 1 wherein when the first terminal and the third terminal of the first set of relays are turned on, the first terminal and the third terminal of the second set of relays are turned on, the first terminal and the second terminal of the third set of relays are turned on, and the third terminal and the fourth terminal of the third set of relays are turned on, the voltage test circuit can be used as a charger.

11. The test instrument of claim 1 wherein when the first terminal and the third terminal of the first set of relays are turned on, the first terminal and the third terminal of the second set of relays are turned on, the first terminal and the fourth terminal of the third set of relays are turned on, and the second terminal and the third terminal of the third set of relays are turned on, the voltage test circuit can be used as a discharger.

* * * * *